United States Patent
Suleiman et al.

(10) Patent No.: US 10,448,511 B2
(45) Date of Patent: Oct. 15, 2019

(54) COMPONENT SHEET AND METHOD OF SINGULATING

(71) Applicant: Texas Instruments Incorporated, Dallas, TX (US)

(72) Inventors: Wan Mohd Misuari Suleiman, Kaula Lumpur (MY); Nageswararau Krishnan, Kuala Lumpur (MY)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/973,039

(22) Filed: May 7, 2018

(65) Prior Publication Data

US 2018/0255644 A1    Sep. 6, 2018

Related U.S. Application Data

(62) Division of application No. 15/145,083, filed on May 3, 2016, now abandoned.

(51) Int. Cl.
| | |
|---|---|
| *H05K 1/18* | (2006.01) |
| *H01L 23/495* | (2006.01) |
| *H01L 23/52* | (2006.01) |
| *H01L 23/62* | (2006.01) |
| *H01L 23/544* | (2006.01) |

(52) U.S. Cl.
CPC ............ *H05K 1/182* (2013.01); *H01L 23/495* (2013.01); *H01L 23/52* (2013.01); *H01L 23/544* (2013.01); *H01L 23/62* (2013.01)

(58) Field of Classification Search
CPC .......... H01C 13/00; H01C 1/00; H01C 17/00; H05K 1/182; H01L 23/495; H01L 23/52
See application file for complete search history.

(56) References Cited

U.S. PATENT DOCUMENTS

| | | |
|---|---|---|
| 4,418,474 A | 12/1983 | Barnett |
| 7,586,198 B2 | 9/2009 | Borland et al. |
| 7,847,391 B2 | 12/2010 | Udompanyavit et al. |
| 8,053,898 B2 | 11/2011 | Marcoux |
| 8,129,228 B2 | 3/2012 | Udompanyavit et al. |
| 8,281,483 B2 | 10/2012 | Hofmann et al. |
| 8,324,721 B2 | 12/2012 | Udompanyavit et al. |
| 8,697,496 B1 | 4/2014 | Abbott et al. |
| 8,928,115 B2 | 1/2015 | Hauenstein |
| 2002/0173070 A1 | 11/2002 | Bolken et al. |
| 2007/0063333 A1 | 3/2007 | Mohd Arshad |
| 2008/0316504 A1 | 12/2008 | Nemets et al. |
| 2011/0041312 A1 | 2/2011 | Hofmann |
| 2011/0042265 A1 | 2/2011 | Hofmann |
| 2011/0043982 A1 | 2/2011 | Poetzinger |
| 2014/0306330 A1 | 10/2014 | Williams |
| 2015/0036984 A1 | 2/2015 | Wang et al. |
| 2015/0311144 A1 | 10/2015 | Williams et al. |
| 2015/0380384 A1 | 12/2015 | Williams et al. |
| 2016/0005732 A1 | 1/2016 | Wood |
| 2016/0103175 A1 | 4/2016 | Zeise et al. |
| 2017/0317013 A1 | 11/2017 | Yue et al. |
| 2017/0341170 A1 | 11/2017 | Suleiman |

*Primary Examiner* — Kyung S Lee
(74) *Attorney, Agent, or Firm* — Dawn Jos; Charles A. Brill; Frank D. Cimino

(57) ABSTRACT

A sheet of electronic components includes a plurality of electronic components. A plurality of connecting members mechanically connects the electronic components together. A first fiducial marker is located at a first predetermined location on the sheet and a second fiducial marker is located at a second predetermined location on the sheet.

19 Claims, 7 Drawing Sheets

COMPONENT SHEET AND METHOD OF SINGULATING

CROSS REFERENCE

This application is a division of U.S. application Ser. No. 15/145,083, filed May 3, 2016, the contents of which is herein incorporated by reference in its entirety.

BACKGROUND

Shunt resistors are low resistance resistors that are used in many electronic devices and circuits to measure the current flow through a component or a circuit. The voltage drop across a shunt resistor is measured, which readily provides the current flow through the shunt resistor. The resistance of a shunt resistor is very low so as to minimize the effects of the shunt resistance on the circuit. If the shunt resistance is high, the shunt resistor will draw power from the component or circuit from which it is measuring current. In addition to having low resistance, the shunt resistor has to pass all the current flowing through the circuit or component. Accordingly, shunt resistors are components that typically have high volumes so as to have low resistance and the ability to conduct the current flow through the component or circuit.

SUMMARY

A sheet of electronic components includes a plurality of electronic components. A plurality of connecting members mechanically connects the electronic components together. A first fiducial marker is located at a first predetermined location on the sheet and a second fiducial marker is located at a second predetermined location on the sheet.

DETAILED DESCRIPTION

Figure 1:
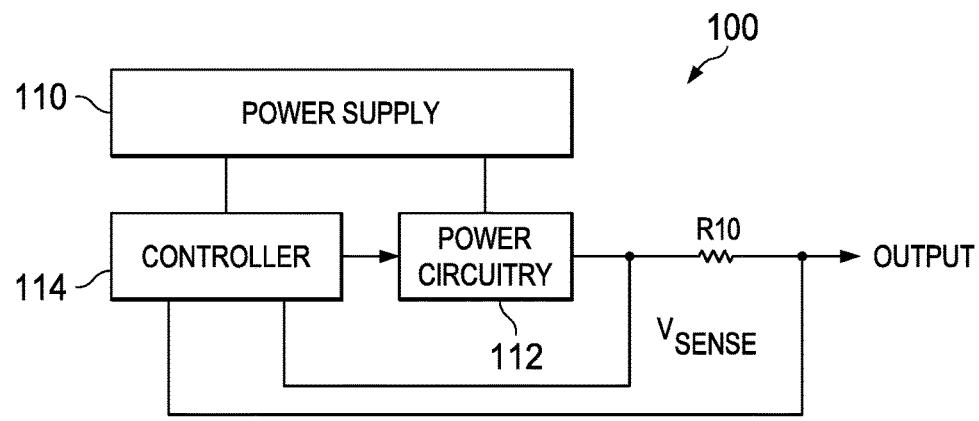
FIG. 1 is a block diagram of a circuit that has a high current, low resistance resistor that is functioning as a shunt resistor.

FIG. 1 is a block diagram of a circuit 100 that has high current, low resistance resistor R10 that is functioning as a shunt resistor. The circuit 100 is an example of one of numerous circuit designs that use a low resistance, high current resistor as a shunt resistor. The circuit 100 includes a power supply 110 that supplies power to components and circuitry within the circuit 100. Power circuitry 112 generates an output signal that conducts through the shunt resistor R10. The current passing though the shunt resistor R10 generates a sensing voltage $V_{SENSE}$ that is proportional to the current. A controller 114 monitors the sensing voltage $V_{SENSE}$ and controls the power circuitry in response to the sensing voltage $V_{SENSE}$.

The resistance of the shunt resistor R10 is very low in order to minimize the effects of the shunt resistor R10 on the other components in the circuit 100. If the resistance of the shunt resistor R10 was high, the shunt resistor R10 would expend power that would otherwise be conducted to the output. In addition to having low resistance, the shunt resistor R10 has to pass all the current flowing from the power circuitry 112 to the output. Accordingly, shunt resistors, such as the shunt resistor R10, are components having high volume and/or a large cross section so as to have low resistance and the ability to conduct high current. The high volume of shunt resistors makes them impractical to be fabricated into or physically attached to most integrated circuit dies. Some resistors used as shunt resistors are fabricated from copper alloy.

Figure 2:
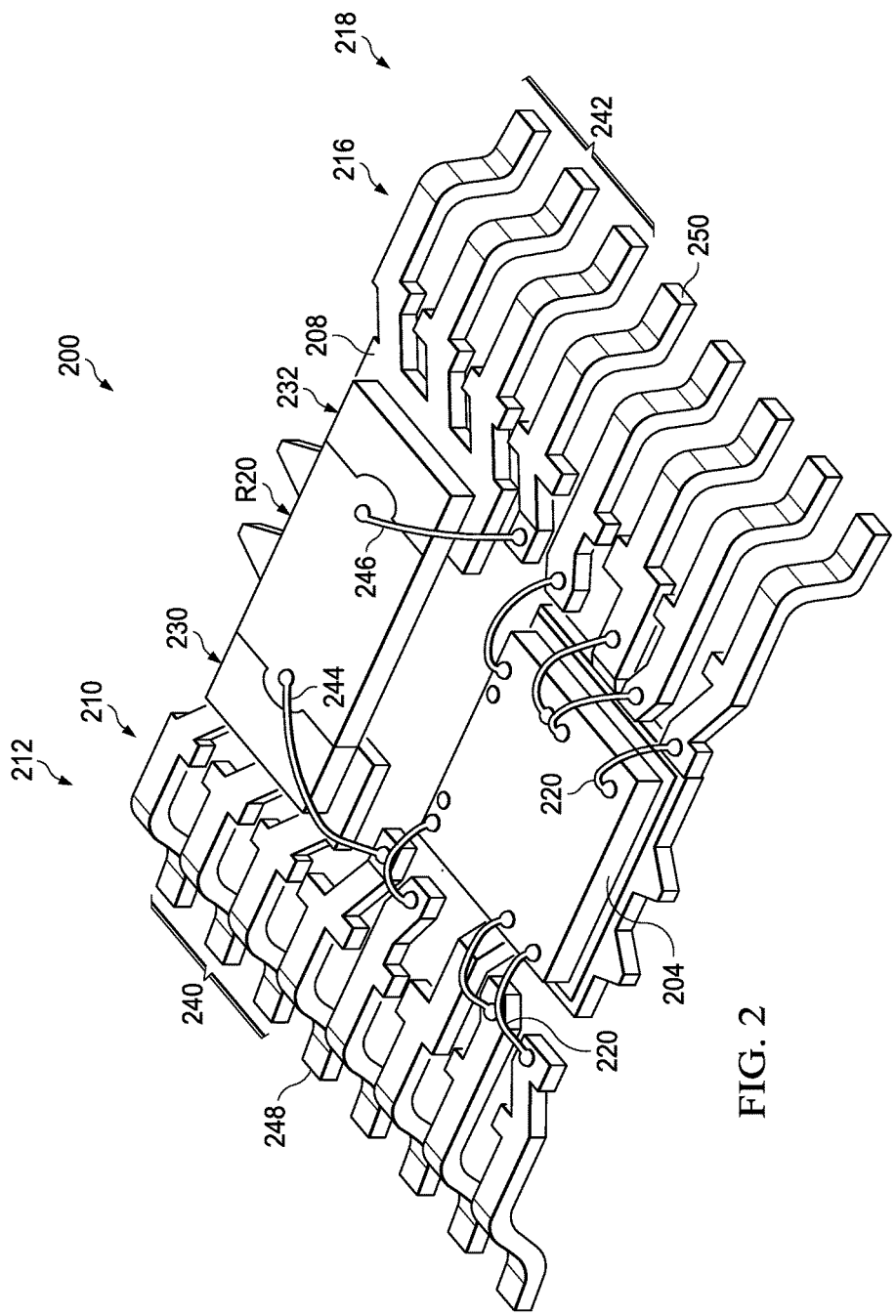
FIG. 2 is a side isometric view of the interior of an exemplary integrated circuit package that includes an integrated circuit die and a shunt resistor.

FIG. 2 is a side isometric view of the interior of an exemplary integrated circuit package 200 that includes an integrated circuit die 204 and a resistor R20. The package 200 may include other devices that secure the die 200 in its locations shown in FIG. 2. In the example of FIG. 2, the resistor R20 has low resistance and the capability of passing high current, such as the current conducted through a shunt resistor. Both the die 204 and the resistor R20 are mechanically and electrically coupled to a lead frame 208 having leads 210 extending from a first side 212 and leads 216 extending from a second side 218. The die 204 is electrically coupled to the leads 210 and 216 by way of wire bonds 220. The die 204 draws relatively little current, so conventional wire bonds 220 are sufficient for coupling the die 204 to the leads 210 on the first side 212 and the leads 216 on the second side 218 of the lead frame 208.

The resistor R20 functions as a shunt resistor, so the die 204 likely does not have the current handling capability of the resistor R20. The resistor R20 may be fabricated from the materials described above so as to be a block of conductive material, such as a block of copper alloy. The resistor R20 has a first end 230 and a second end 232. The ends 230 and 232 are coated with a conductive adhesive to mechanically and electrically couple the resistor R20 to the leads 210 on the first side 212 of the lead frame 208 and the leads 216 on the second side 218 of the lead frame 208. In order to handle the current flow requirements of the resistor R20 when it is used as a shunt resistor, the first end 230 is electrically coupled to a plurality of leads 240 and the second end 232 is electrically coupled to a plurality of leads 242. The resistor R20 has pads or other locations for receiving wire bonds 244 and 246, which are coupled to leads 248 and 250, respectively. The leads 248 and 250 are for measuring a sensing voltage $V_{SENSE}$ generated by current flow through the resistor R20 as described with reference to FIG. 1.

The resistor R20 is singulated from a sheet of resistors as a small chip module separate from the die 204 and prior to placement within the package 200. Prior to singulation of the resistors, auto saw alignment is required to be performed in order to correctly cut the resistors to the correct size and shape. A singulating device, such as a saw or the like, singulates the resistors from the sheet of resistors. Conventional auto saw alignment methods used in silicon wafer dicing depend on device chip (die) unique features for alignment reference and are not suitable for singulating resistors such as the resistor R20.

Figure 3B:
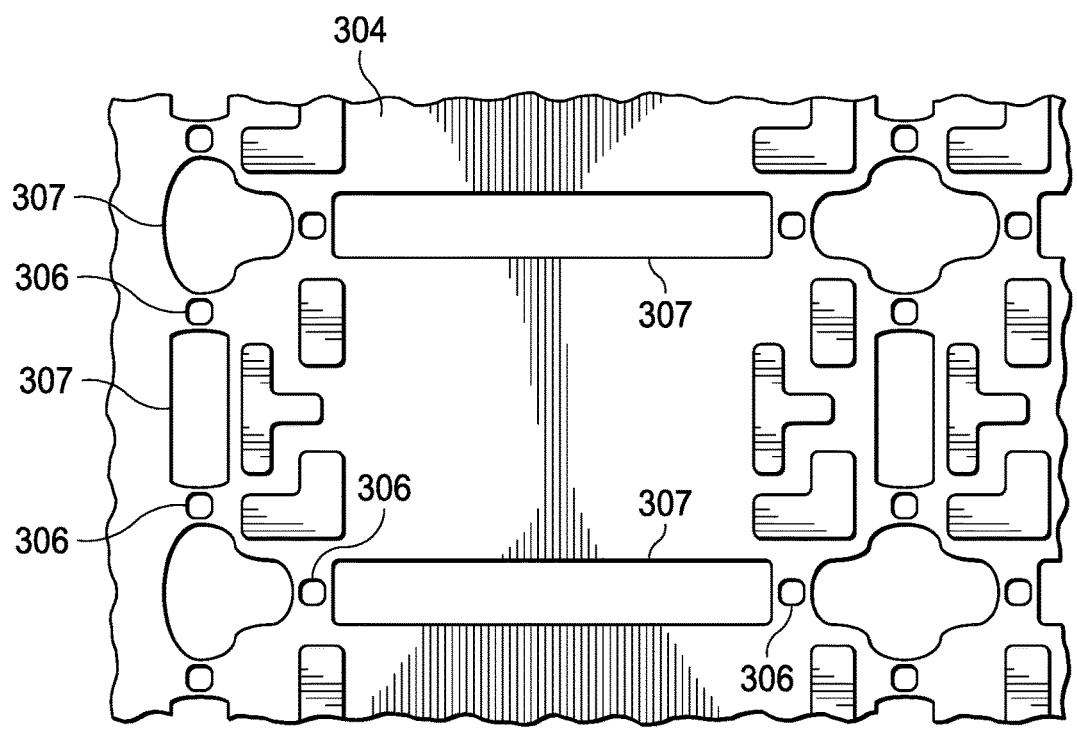
FIG. 3B is an enlarged view of a single resistor on the sheet of FIG. 3A.
Figure 3A:
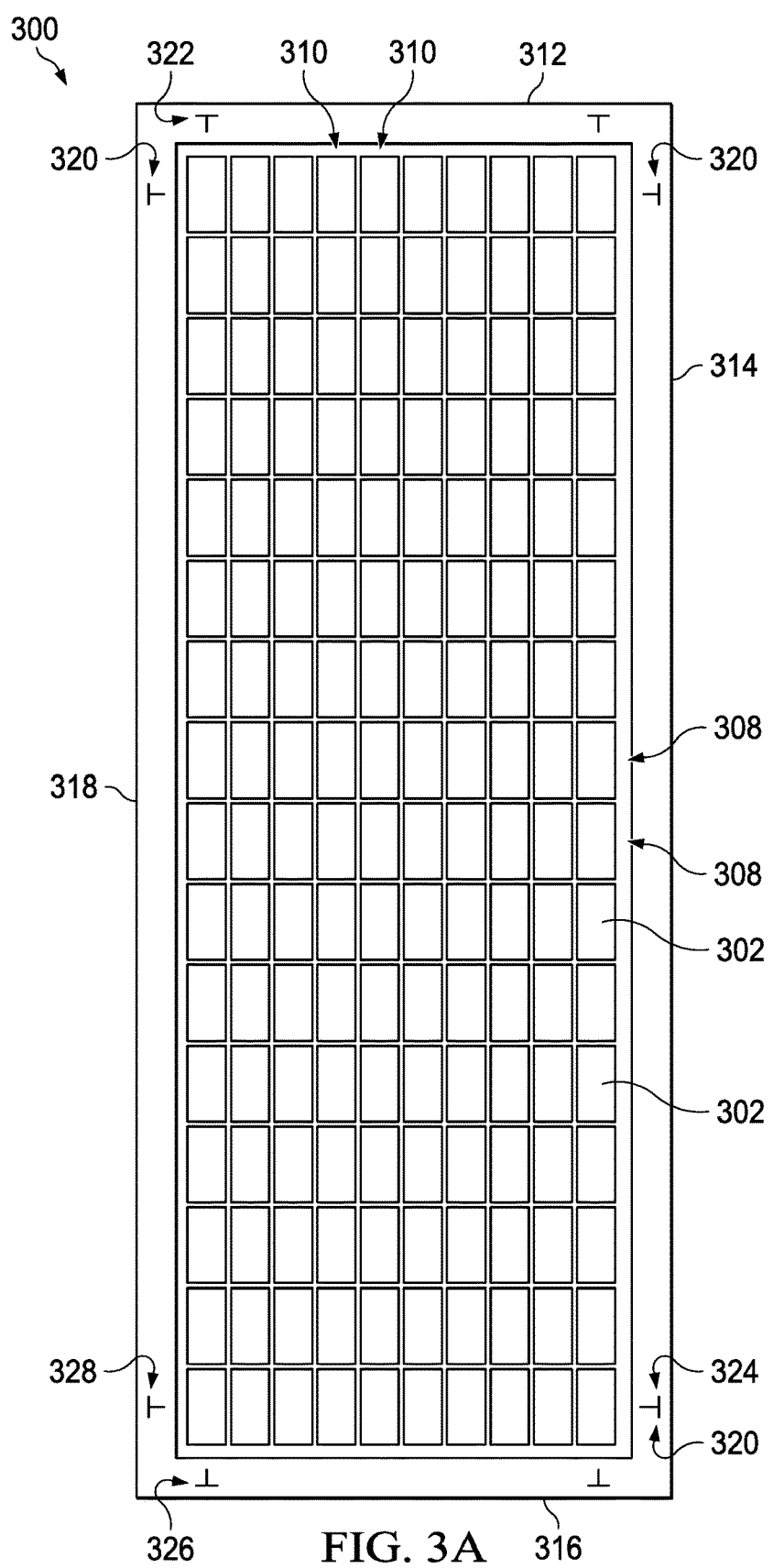
FIG. 3A is a top plan view of a sheet having a plurality of resistors formed therein.

FIG. 3A is a top plan view of a sheet 300 having a plurality of resistors 302 formed therein and FIG. 3B is an enlarged view of a single resistor 304. In some examples, the whole sheet 300 is fabricated from the material of the resistors 302, such as the copper alloy described above. The sheet 300 may be stamped or processed, such as etched, to form the individual resistors 302 shown in FIG. 3A and the resistor 304 shown in FIG. 3B. As shown in FIG. 3B, a plurality of connection members 306 connect individual resistors to each other to form the sheet 300 of resistors. The connection members 306 are located between cut-out portions 307 of the sheet. These connection members 306 have to be cut to singulate the individual resistors from one another. If the cutting is not aligned with the connection members 306, the singulating or cutting device may contact resistors, which will damage or destroy the resistors.

In the example of FIG. 3A, the resistors 302 are arranged in an array having a plurality of rows 308 and columns 310, which are orthogonal. The sheet has a first edge 312, a second edge 314, a third edge 316, and a fourth edge 318. The sheet 300 includes a plurality of fiducial markers, which are referred to herein as "fiducials," to provide points of reference for singulating operations. The fiducials may be virtually any marker having a shape that is able to be imaged by an imaging device as described below. The fiducials are located at predetermined locations on the sheet 300. Therefore, when the fiducials are imaged, an imaging system can correlate the locations of the images of the fiducial with a singulation device to perform accurate singulation as described below.

In the example of FIG. 3A, the fiducials 320 on the sheet 300 are T-shaped fiducials. Further to the example of FIG. 3A, the fiducials are oriented in four directions depending on their locations on the sheet 300. In other examples, the fiducials 320 are not oriented in any specific direction, but are placed at predetermined locations on the sheet 300. A fiducial 322 provides an example of a first orientation wherein the T-shaped fiducial is referred to here as being upright. In the example of FIG. 3, fiducials having the first orientation are located proximate the first edge 312 of the sheet 300. A fiducial 324 provides an example of a second orientation wherein the T-shaped fiducial is rotated clockwise ninety degrees from the first orientation. The orientation of the fiducial 324 is referred to herein as being rotated right. In the example of FIG. 3A, fiducials having the second orientation are located proximate the second edge 314. A fiducial 326 provides an example of a third orientation wherein the T-shaped fiducial is oriented upside down with reference to the first orientation. The third orientation is referred to herein as the inverse orientation. In the example of FIG. 3A, fiducials having the third orientation are located proximate the third edge 316. A fiducial 328 provides an example of a fourth orientation, wherein the T-shaped fiducial 328 is rotated ninety degrees counter clockwise relative to the first orientation. The fourth orientation is referred to herein as being rotated left. In the example of FIG. 3A, fiducials having the fourth orientation are located on the fourth edge 318.

In other examples, the different orientations of the fiducials may indicate a corner of the sheet 300. More specifically, fiducials having the first orientation may be located proximate a first corner, fiducials having a second orientation may be located proximate a second corner and so on. In some examples, the horizontal portion of an upright "T" is located a predetermined distance from the edge of the sheet and the vertical portion of the "T" is located at a predetermined location on the sheet 300.

The fiducials 320 provide orientation markers for visual alignment of the sheet 300 relative to a singulating device or the like (not shown in FIG. 3A) that singulates the resistors 302. The horizontal bar in fiducials having the first orientation, such as the fiducial 322, provide an indication as to the location of the first side 312. The vertical portions of the fiducials 320 provide a first indication as to the orientation of the sheet 300. Accordingly, fiducials having the first orientation are correlated with the first edge 312 of the sheet 300 by an imaging system. The same applies to the third orientation, such as with the fiducial 326 wherein the vertical portion extending up points toward the interior of the sheet 300, so the imaging system correlates the third orientation with the third edge 316. The vertical portions of the fiducials on the second and third edges 314 and 318 provide indications that the fiducials are located proximate the edges 314 and 318. The horizontal portions of the fiducials indicate the edge of the sheet 300 on which the fiducials are located. When the horizontal portion is to the left of the vertical portion, the fiducial is located proximate the second edge 314 and when the horizontal portion is to the right of the vertical portion, the fiducial is located proximate the fourth edge 318.

In addition to providing indications as to the locations of the edges of the sheet 300, the fiducials 320 also provide information regarding the location of the sheet 300. The fiducials 320 are located at predetermined locations on the sheet 300. For example, the fiducials 320 may be located at predetermined distances from the edges. When an imaging system locates and identifies a fiducial, it can readily determine the location of the sheet 300 based on the location of the fiducial. As described in greater detail below, the location information is used to determine the alignment and/or orientation of the sheet 300 relative to a singulating device prior to cutting or singulating the individual resistors 302 from the sheet 300.

Figure 4:
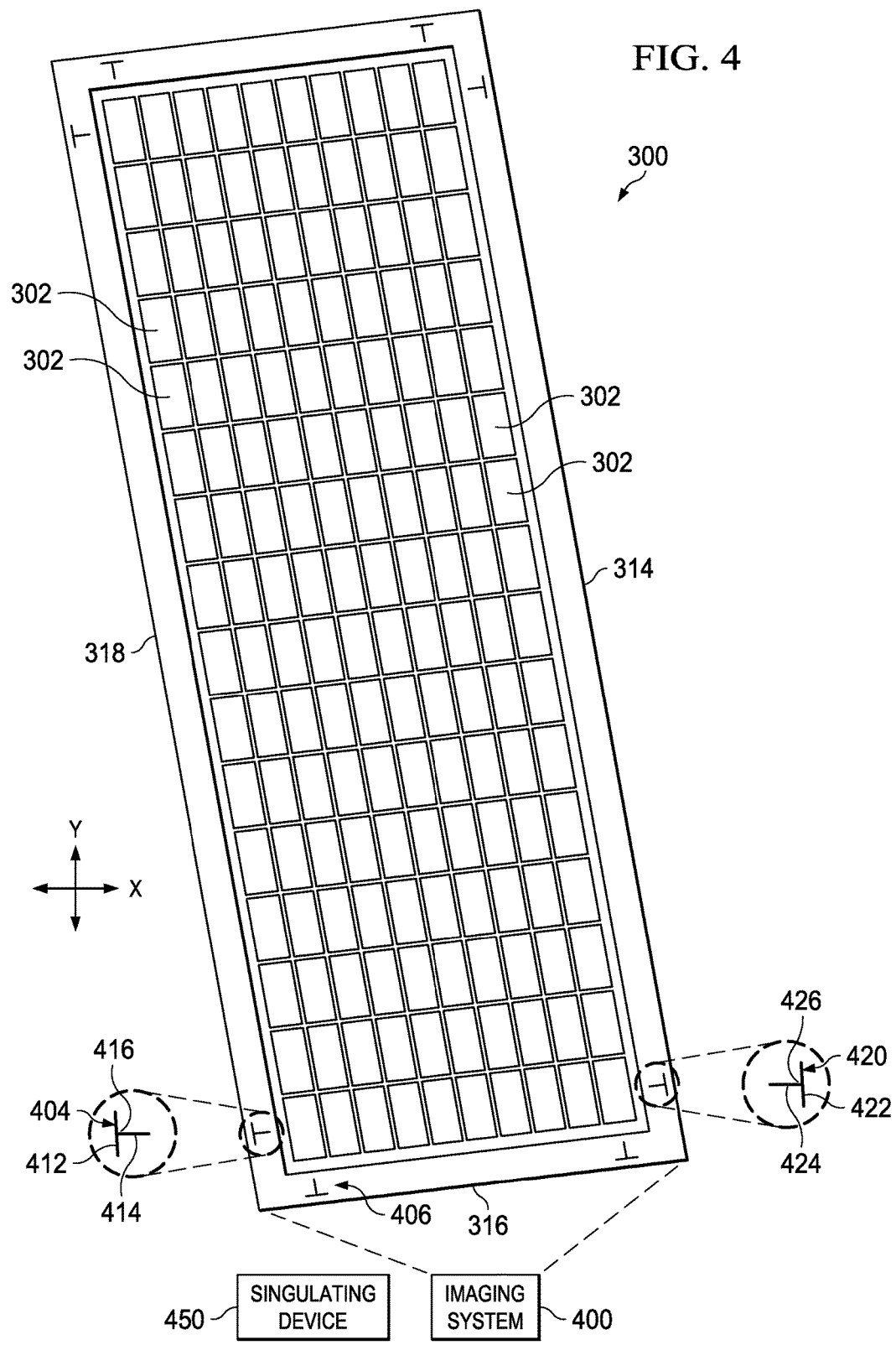
FIG. 4 is a top plan view of the sheet of FIG. 3A in a misaligned position relative to a singulating device.

FIG. 4 shows the sheet 300 in a misaligned position relative to a singulating device 450. In the example of FIG. 4, the singulating device 450 operates along the X-Y coordinates of the Cartesian plane shown in FIG. 4. The sheet 300 and/or the singulating device 450 must be rotated so that they are aligned prior to singulating the resistors 302, otherwise the resistors 302 will be damaged during the singulating process. An imaging system 400 captures images of the sheet 300 and identifies the fiducials and their locations, which is indicative of the location and orientation of the sheet 300. For example, the imaging system 400 may include a processing component that identifies the fiducials and their orientations. The sheet and/or the singulating device 450 are then oriented to singulate the resistors 302 without damaging the resistors 302. For example, an aligning component (not shown) may orient or align the sheet and/or the singulating device 450.

In the example of FIG. 4, the imaging system 400 captures an image proximate the intersection of the third edge 316 and the fourth edge 318 of the sheet 300 where a fiducial 404 and a fiducial 406 are located. In this example, the imaging system 400, or a processing component associated with the imaging system 400, identifies the fiducial 404, which is shown with an enlarged view. The fiducial 404 has the fourth orientation, so it has a vertical portion 412 with a horizontal portion 414 extending to the right. The vertical portion 412 and the horizontal portion 414 intersect at an intersection 416. The imaging system 400 identifies the right extending vertical portion 414 as a fiducial located proximate the fourth edge 318. In some examples, the imaging system 400 may analyze characteristics of the fiducial 406 to determine that it is imaging an area of the sheet 300 proximate the third edge 316 and the fourth edge 318.

The imaging system 400 images a second fiducial to obtain information to ascertain the orientation of the sheet 300 relative to the singulating device 450. In the example of FIG. 4, the imaging system 400 images a second fiducial 420 that is located proximate the second edge 314 of the sheet 300 and has the second orientation. The fiducial 420 has a vertical portion 422 with a horizontal portion 424 extending from the left of the vertical portion 422. The horizontal portion 424 and the vertical portion 422 intersect at an intersection 426. The imaging system 400 identifies the horizontal portion 424 extending to the left of the vertical portion 422 as being a fiducial located proximate the second edge 314. The location of the intersection 426 provides the location and orientation of the sheet 300 relative to the singulating device 450.

Figure 5:
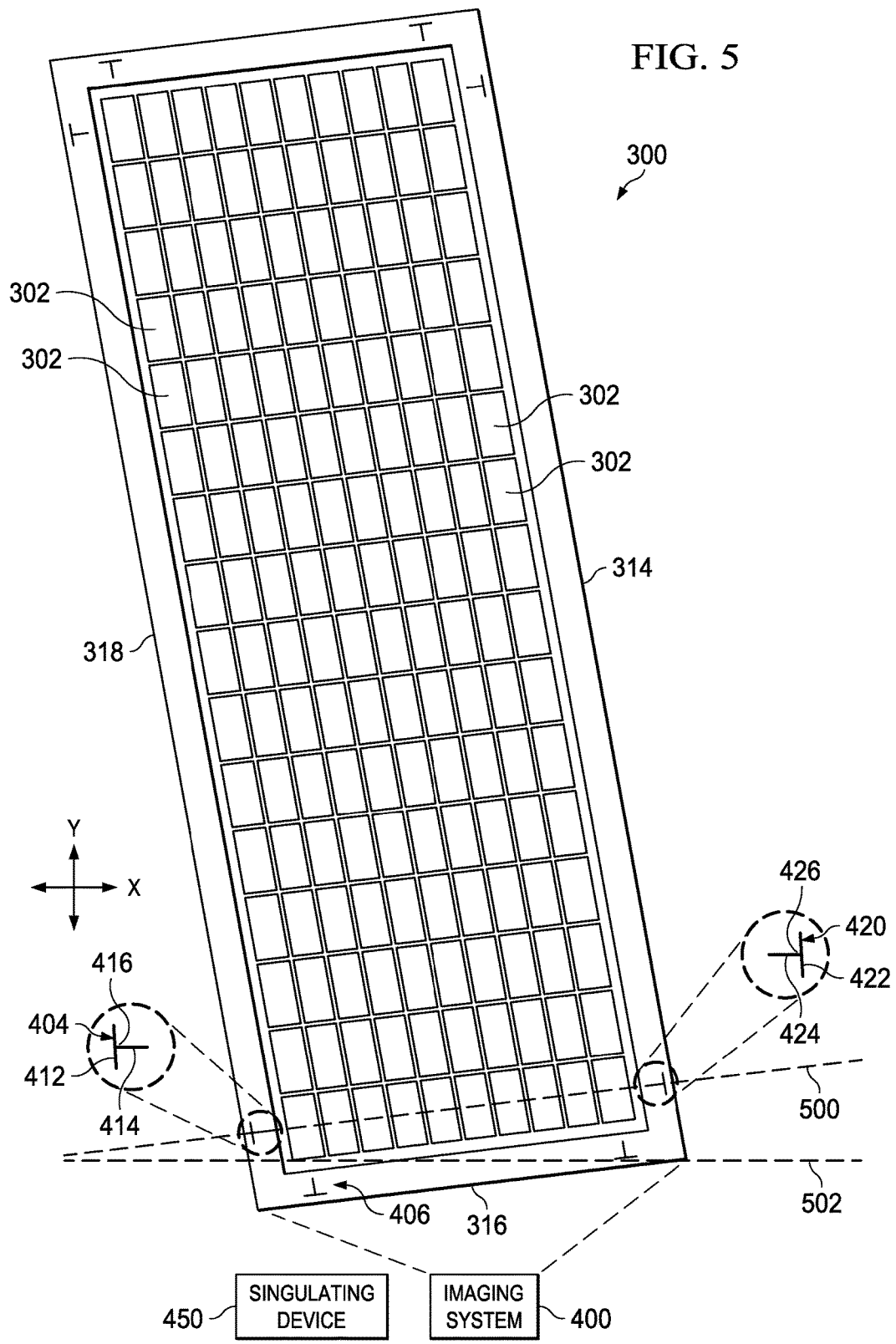
FIG. 5 is a top plan view of the sheet of FIG. 4 being analyzed to determine its orientation.

FIG. 5 is a top plan view of the sheet 300 of FIG. 4 being analyzed to determine its orientation. The imaging system 400 or a component associated therewith has determined the locations of the fiducials 404 and 420, which are located at predetermined positions on the sheet 300. The imaging system 400 generates an axis 500 that intersects both intersections 416 and 426 of the fiducials 404 and 420, respectively. The axis 500 is compared to an axis 502 that is parallel to the x-axis of the Cartesian plane, which is associated with the sawing directions of the singulating device. The imaging system 400 generates signals to rotate the sheet 300 and/or the singulating device so that the axes 500 and 502 are parallel. When the axes 500 and 502 are parallel, the singulating device 450 may cut the sheet 300 to form individual resistors 302.

The sheet 300 has been described above as having T-shaped fiducials 320 located at predetermined locations on the sheet 300. The fiducials may have other shapes that enable an imaging system to locate them. For example, the fiducials may be X-shaped or the fiducials may be round. The fiducials may be placed on the sheet 300 by a plurality of different methods. For example, the fiducials may be printed, stamped, plated, or etched onto or into the sheet 300. The sheet 300 has been described herein as being a sheet of resistors. In other examples, the sheet may include other components, such as other discrete components or other metal components.

Figure 6:
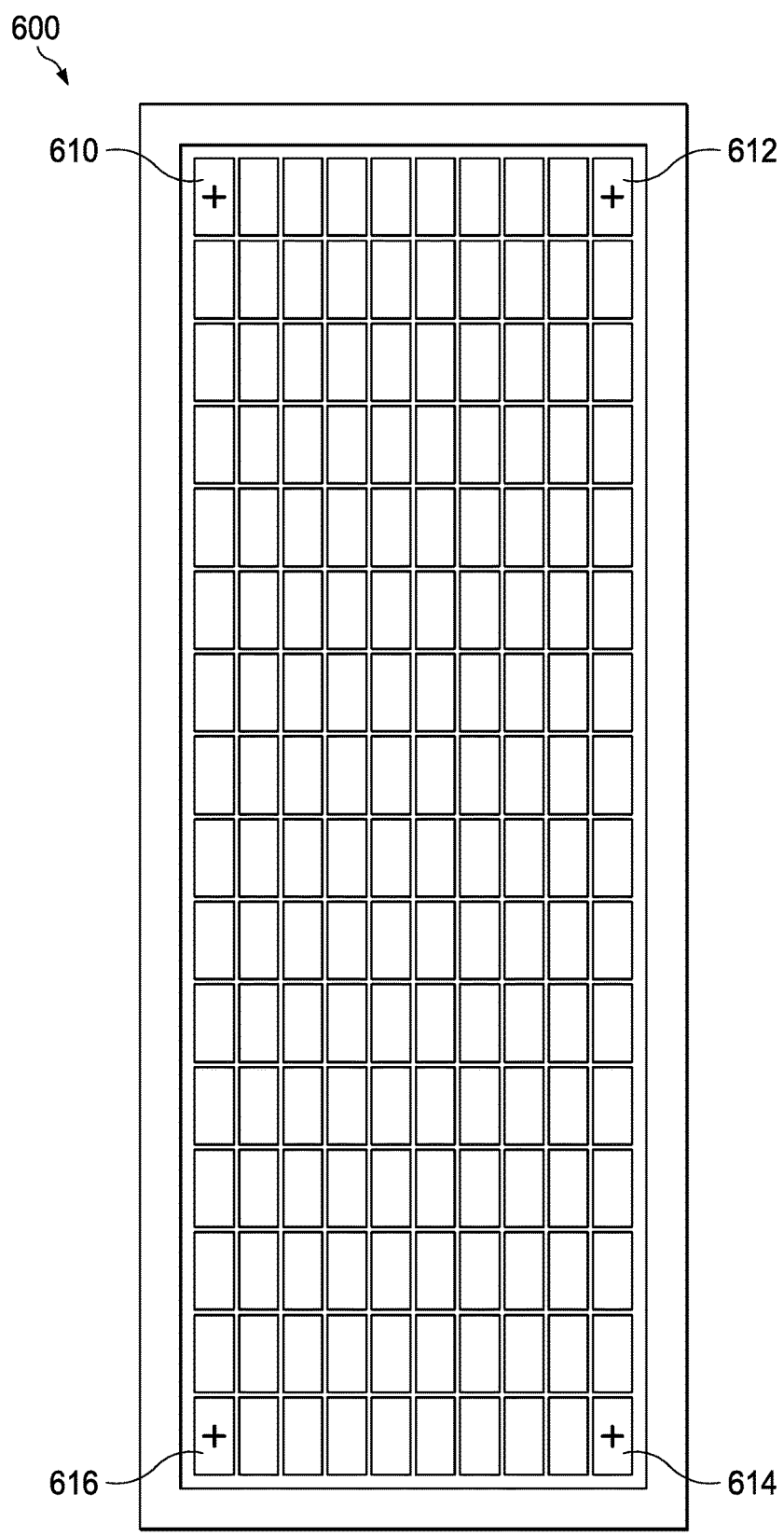
FIG. 6 is a top plan view of a sheet of resistors having fiducial markers located on specific resistors.

In some examples, the fiducials are placed on the resistors in the sheet. FIG. 6 is a top plan view of a sheet 600 of resistors having fiducials located on resistors. In the example of FIG. 6, four resistors located in the corners of the sheet 600 have fiducials located thereon. The resistors having fiducials located thereon are a first resistor 610 located in an upper left corner, a second resistor 612 located in an upper right corner, a third resistor 614 located in a lower right corner, and a fourth resistor 616 located in a lower left corner. The fiducials on these resistors 610-616 are used to identify the location and orientation of the sheet 600 in the same manner as described above except that the fiducials are located on resistors instead of the edges of the sheet 300, FIG. 3A.

Figure 7A:
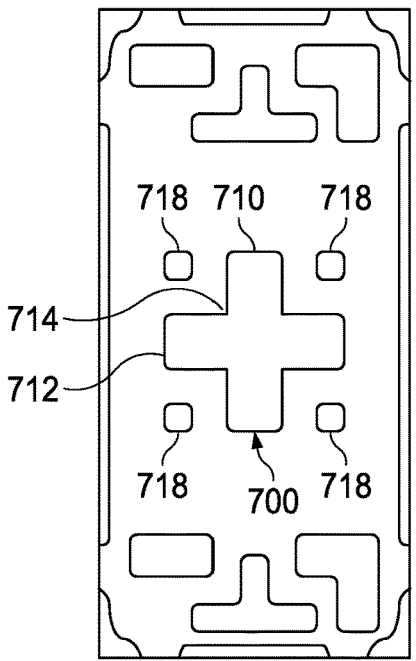
FIG. 7A is an example of a fiducial in the shape of a cross.
Figure 7B:
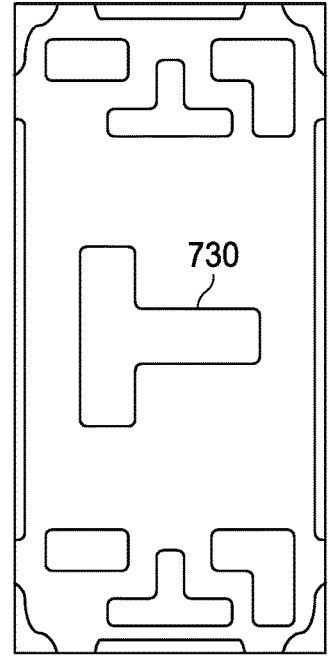
FIG. 7B is an example of a T-shaped fiducial.

FIGS. 7A and 7B are examples of different fiducials that may be applied to the resistors or the sheets. FIG. 7A is an example of a fiducial 700 in the shape of a cross. The cross has a horizontal portion 710 and a vertical portion 712 that intersect at an intersection 714. The combination of the horizontal portion 710, the vertical portion 712, and the intersection 714 provide imaging information to enable the imaging system 400, FIG. 4, to determine the location and orientation of the sheet 600, FIG. 6. In the example of FIG. 7A, the fiducial 700 includes spots 718 that distinguish the fiducial 700 from other artifacts that may be imaged by the imaging system 400. In some embodiments, the fiducial 700 is rotated forty-five degrees to form an X-shaped fiducial.

FIG. 7B is an example of a T-shaped fiducial 730. The fiducial 730 may have the same orientation on all the resistors 610-616, FIG. 6. In other examples, the fiducial 730 has a different orientation depending on which corner it is located. The imaging system 400, FIG. 4, may then readily determine the location and orientation of the sheet 600, FIG. 6.

Having described various fiducials and different locations of the fiducials on a sheet of components, the singulating device and methods of singulating will now be described. Reference is made to FIG. 4 where the sheet 300 is misaligned with a singulating device 450, and wherein the singulating device 450 operates or cuts along the Cartesian plane of FIG. 4. The imaging system 400 images the fiducial 404 and determines the location of the fiducial 404, such as the location of the intersection 416. Simultaneously or subsequently, the imaging system 400 images the fiducial 420, such as the intersection 426. By analyzing the locations of the fiducials 404 and 420, the imaging system 400 is able to determine the location and orientation of the sheet 300. One example of this analysis is shown by the axes 500 and 502 of FIG. 5 wherein non-parallel axes is an indication of the sheet 300 and the singulating device 450 not being oriented together. In response to the analysis, the sheet 300 and/or the singulating device 450 is reoriented and first cuts to singulate the resistors 302 may be performed. The orientation enables the singulating device 450 to cut the connecting members 306, FIG. 3B, without damaging resistors 302 or other components.

The sheet 300 may be rotated ninety degrees to perform second cuts that are orthogonal to the first cuts. The imaging system 400 may perform another analysis to determine if the rotated sheet is oriented with the singulating device 450 as described above. Accordingly, the sheet 300 and/or the singulating device 450 may be rotated so that they are properly oriented to perform the orthogonal cuts.

Figure 8:
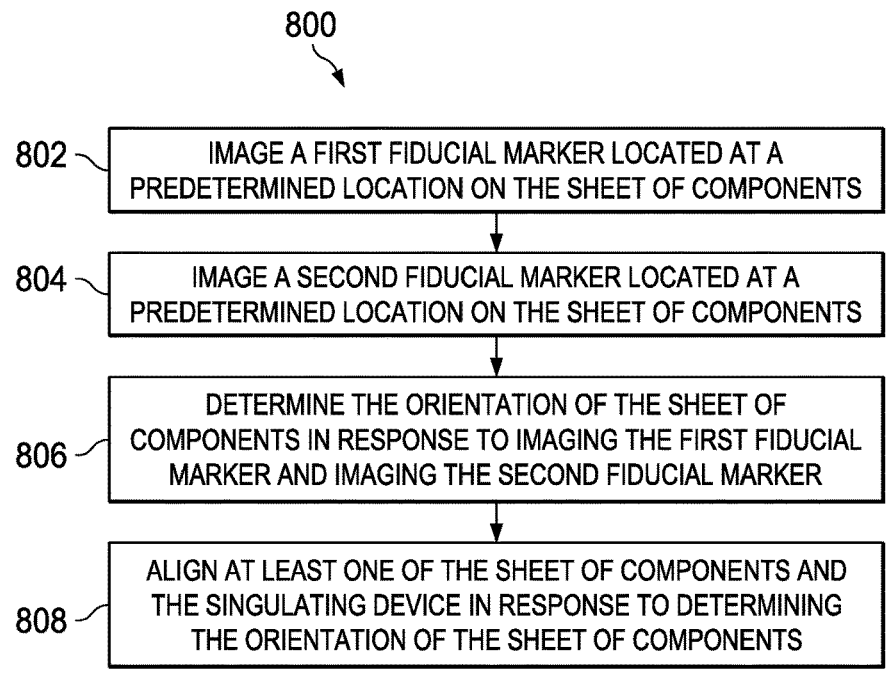
FIG. 8 is a flow chart describing a method of aligning a sheet of components to a singulating device.

FIG. 8 is a flow chart 800 describing a method of aligning a sheet of components to a singulating device. In step 802 a first fiducial marker located at a predetermined location on the sheet of components is imaged. In step 804 a second fiducial marker located at a predetermined location on the sheet of components is imaged. The method continues with determining the orientation of the sheet of components in response to imaging the first fiducial marker and imaging the second fiducial marker at step 806. At step 808 the method includes aligning the sheet of components and the singulating device in response to determining the orientation of the sheet of components.

While some examples of component sheets and orientation methods have been described in detail herein, it is to be understood that the inventive concepts may be otherwise variously embodied and employed and that the appended claims are intended to be construed to include such variations except insofar as limited by the prior art.

What is claimed is:
1. A method comprising:
    imaging a first fiducial marker located at a predetermined location on a sheet of components;
    imaging a second fiducial marker located at a predetermined location on the sheet of components;

determining the orientation of the sheet of components in response to imaging the first fiducial marker and imaging the second fiducial marker; and aligning at least one of the sheet of components and a singulating device in response to determining the orientation of the sheet of components, wherein determining the orientation of at least one of the sheet of components includes fitting an axis between an image of the first fiducial marker and the second fiducial marker and comparing the axis to an axis associated with the singulating device.

2. The method of claim 1, further comprising determining the orientation of at least one of the first fiducial marker and the second fiducial marker.

3. The method of claim 1, wherein the sheet of components has a plurality of edges and at least one of the first fiducial marker and the second fiducial marker is located proximate at least one of the plurality of edges.

4. The method of claim 1, wherein at least one of the first fiducial marker and the second fiducial marker is located on a predetermined one of the components.

5. The method of claim 1 further comprising placing and electrically connecting at least one of the components and a die on a portions of a lead frame.

6. The method of claim 1, wherein at least one of the first fiducial marker and the second fiducial marker are located on at least one of the components of the sheet of components.

7. The method of claim 1, wherein at least one of the first fiducial marker and the second fiducial marker are etched into the sheet.

8. The method of claim 1, wherein at least one of the first fiducial marker and the second fiducial marker are plated onto the sheet.

9. The method of claim 1, wherein the sheet of components includes resistors.

10. The method of claim 1, wherein the resistors are aligned in an array of parallel columns and parallel rows.

11. The method of claim 1, wherein the first fiducial marker has a first orientation and the second fiducial marker has a second orientation.

12. The method of claim 1, wherein the sheet includes:
a first side with a first fiducial marker located proximate the first side;
a second side with a second fiducial marker located proximate the second side;
a third side with a third fiducial marker located proximate the third side; and
a fourth side with a fourth fiducial marker located proximate the fourth side.

13. The method of claim 1, wherein:
the first, second, third, and fourth fiducial markers have the same shape;
the first fiducial marker has a first orientation;
the second fiducial marker has a second orientation;
the third fiducial marker has a third orientation; and
the fourth fiducial marker has a fourth orientation.

14. The method of claim 1, wherein the sheet includes:
a first corner with a first fiducial marker located proximate the first corner;
a second corner with a second fiducial marker located proximate the second corner;
a third corner with a third fiducial marker located proximate the third corner; and
a fourth corner with a fourth fiducial marker located proximate the fourth corner.

15. The method of claim 1, wherein:
the first, second, third, and fourth fiducial markers have the same shape;
the first fiducial marker has a first orientation;
the second fiducial marker has a second orientation;
the third fiducial marker has a third orientation; and
the fourth fiducial marker has a fourth orientation.

16. A method of making an electrical device comprising:
imaging a first fiducial marker located at a predetermined location on a sheet of components;
imaging a second fiducial marker located at a predetermined location on the sheet of components;
determining the orientation of the sheet of components in response to imaging the first fiducial marker and imaging the second fiducial marker;
aligning at least one of the sheet of components and a singulating device in response to determining the orientation of the sheet of components; and
singulating the sheet of components to separate the components; and
placing and electrically connecting at least one of the components and a die on a portion of a lead frame;
wherein determining the orientation of at least one of the sheet of components includes fitting an axis between an image of the first fiducial marker and the second fiducial marker and comparing the axis to an axis associated with the singulating device.

17. The method of claim 16, further comprising determining the orientation of at least one of the first fiducial marker and the second fiducial marker.

18. The method of claim 16, wherein the sheet of components has a plurality of edges and at least one of the first fiducial marker and the second fiducial marker is located proximate at least one of the plurality of edges.

19. The method of claim 16, wherein at least one of the first fiducial marker and the second fiducial marker is located on a predetermined one of the components.

* * * * *